United States Patent [19]
Miyauchi

[11] Patent Number: 5,841,699
[45] Date of Patent: Nov. 24, 1998

[54] STORAGE DEVICE AND METHOD TO DETECT ITS DEGRADATION

[75] Inventor: Shigenori Miyauchi, Tokyo, Japan

[73] Assignee: Mitsubishi Denki Kabushiki Kaisha, Tokyo, Japan

[21] Appl. No.: 760,558

[22] Filed: Dec. 4, 1996

[30] Foreign Application Priority Data

Jun. 10, 1996 [JP] Japan ..................................... 8-147175

[51] Int. Cl.[6] ............................ G11C 29/00; G11C 16/00
[52] U.S. Cl. ....................... 365/185.33; 365/201; 711/103
[58] Field of Search .................................... 711/103, 202; 365/201, 185.33

[56] References Cited

U.S. PATENT DOCUMENTS 5,740,396  4/1998  Mason ...................................... 711/103

FOREIGN PATENT DOCUMENTS 5-74179  3/1993  Japan .

Primary Examiner—Jack A. Lane

[57] ABSTRACT

The storage device of the present invention comprises: an interface circuit, a memory comprising a plurality of block-erase type, nonvolatile memories, a control circuit for managing and controlling the memory, and an address conversion table. The control circuit searches for an erase block with an empty area and issues a command signal to the memory to cause the memory to apply voltage pulses to the selected erase block. The memory checks to determine whether or not the erase operation has been completed every time the voltage pulse is applied to the erase block, and if the erase operation has not been completed, the control unit issues another command signal to cause the memory to apply another voltage pulse to the erase block and thus determines the level of degradation of the erase characteristic of the erase block based on the number of voltage pulses applied to that erase block.

17 Claims, 6 Drawing Sheets

STORAGE DEVICE AND METHOD TO DETECT ITS DEGRADATION

BACKGROUND OF THE INVENTION

1. Field of the Invention

The present invention relates to a storage device utilizing nonvolatile memory, such as flash memory, capable of a limited number of block-erase type erase operations.

2. Description of the Prior Art

When data is written in a storage device, particular areas of the storage device are used more frequently than others for erase and write operations. For example, a storage device operating under DOS (Disk Operating System) has areas used for data management such as a FAT (File Allocation Table) and a directory entry table which stores information about the files stored in the storage device. The information in those areas is written and erased very frequently. Since a storage device such as a hard disk has no limit on the number of writing and erasing operations, a large difference in the number of writing or erasing operations between one area and another causes no problems. However, since flash memory can be erased only a limited number of times, a storage device using flash memory cannot be used when the area used for data management exceeds that limit.

In order to solve this problem an address conversion table and an erase operation number storage area for counting the total number of erase operations have been introduced. Typically a storage device includes a few to a few tens of flash memories, each of which has a plurality of erase blocks. FIG. 8 shows the configuration of an erase block of a conventional flash memory. The erase block 100 shown in FIG. 8 comprises an erase operation number storage area 101, a host address storage area 102 which stores addresses assigned by a host device which is connected to the storage device, and a data storing area 103 which stores data from the host system.

When the number stored in the erase operation number storage area 101 reaches to a predetermined number, the write and erase operation is not allowed to be performed in the corresponding erase block. Instead, data from the host system is written in another erase block which has been used less frequently for the write and erase operation. Thus, the erase numbers for all the erase blocks can be made more or less homogeneous. Typically the predetermined number is the maximum number of allowable erase operations in the erase blocks as determined by individual flash memory manufacturers.

The aforementioned maximum number of allowable erase operations is the number the manufacturer guarantees: if the total number of erase operations is less than that number, no problem arises. There is, in fact, a variation between the erase blocks in terms of actual maximum numbers of allowable erase operations. There is also a variation between the erase blocks in terms of the writing and erasing speeds. Therefore, if that maximum number is used as the predetermined number for all the erase blocks, certain erase blocks might be usable even after they exceed that maximum number, and therefore such erase blocks will be wasted. On the other hand, other erase blocks might be unusable before they reach that maximum number. However, no method has been developed for detecting degradation before such erase blocks actually fail.

SUMMARY OF THE INVENTION

An essential object of the present invention, therefore, is to solve the aforementioned problem and to provide a storage device utilizing nonvolatile, block-erase type memory, which uses all erase blocks evenly and efficiently regardless of the total number of write and erase operations performed on each erase block. The present invention also provides a method for detecting the level of degradation of the erase blocks.

The present invention relates to a storage device, utilizing block-erase type, nonvolatile memory, used in conjunction with a host system comprising information processing devices. The present invention provides a storage device comprising: (a) an interface circuit for connecting to the host system; (b) a memory comprising a plurality of block-erase type, nonvolatile memories that can be erased by applying voltage pulses; (c) a control circuit for managing and controlling the memory and for exchanging data with the host system through the interface circuit; and (d) an address conversion table for associating a logical sector address, which the host system uses for data management, with a physical sector address, which the storage device uses for data management therein. The control circuit searches for an erase block with an empty area by referring to the address conversion table and issues a command signal to the memory to cause it to apply voltage pulses to the selected erase block. The memory checks to determine whether or not the erase operation has been completed every time the voltage pulse is applied to the erase block. If the erase operation has not been completed, the control circuit issues another command signal to cause the memory to apply another voltage pulse to the erase block and determines the level of degradation of the erase characteristic of the erase block based on the number of voltage pulses applied to it.

More specifically, if the erase operation is not completed after application of a number of voltage pulses equal to a predetermined number, the control circuit determines that the erase block is unwritable and unerasable, and does not store the data from the host system in the erase block. If the erase operation is completed by application of a number of voltage pulses not to exceed the predetermined number, however, the control circuit determines that an erase block is writable and erasable, and stores the data from the host system in the erase block.

Further, the storage device of the present invention may comprise a block information storage area which stores the number of voltage pulses needed to erase each erase block of the memory when the erase operation is performed on the erase block and which also stores a flag for an unwritable and unerasable erase block so that this bad erase block cannot be used. The block information storage area is formed with nonvolatile memory either within the control circuit or within each erase block of the memory.

More specifically, the control circuit determines that an erase block is an unwritable and unerasable bad erase block if the erase operation is not completed after application of a number of voltage pulses equal to a predetermined number, sets the flag on this bad erase block, and does not allow the data from the host system to be stored in this bad erase block. On the other hand, the control circuit determines that an erase block is a writable and erasable normal erase block if the erase operation is completed by application of a number of voltage pulses not to exceed the predetermined number, stores the number of voltage pulses in the block information storage area, and stores the data from the host system in this normal erase block.

The above control circuit requests the memory to apply voltage pulses to an erase block of the memory that has an empty area but does not have a flag set and that has the smallest number of voltage pulses recorded in the block information storage area.

Further, the present invention provides a method of determining the level of degradation of the erase characteristic of a storage device comprising an interface circuit for connecting to a host system containing information processing devices; a memory made up of a plurality of block-erase type, nonvolatile memories that can be erased by applying voltage pulses; a control circuit for managing and controlling the memory and for exchanging data with the host system through the interface circuit; and an address conversion table for associating a logical sector address, which the host system uses for data management, with a physical sector address, which the storage device uses for data management therein.

The method of determining the level of degradation of the erase characteristic of such a storage device mentioned above comprises the following steps: (a) searching, by referring to the address conversion table, for an erase block of the memory with an empty area for storing data; (b) applying voltage pulses to the selected erase block with an empty area; (c) checking to determine whether or not the erase operation on the erase block has been completed every time the voltage pulse is applied to the erase block; (d) repeating the application of a voltage pulse to the erase block if the erase operation has not been completed; and (e) determining the level of degradation of the erase characteristics of the erase block based on the number of voltage pulses applied to the erase block.

More specifically, if the erase operation is not completed after application of a number of voltage pulses equal to a predetermined number, the method determines that the erase block is an unwritable and unerasable bad erase block and does not allow the data from the host system to be stored therein. If the erase operation is completed by application of a number of voltage pulses not to exceed the predetermined number, however, the method determines that an erase block is a writable and erasable normal erase block and stores the data from the host system in it.

The method may further include a step of storing the number of voltage pulses needed to erase each erase block every time the erase operation is performed on the erase block and another step of setting a flag for a bad erase block so that the bad erase block cannot be used.

More specifically, the method determines that an erase block is an unwritable and unerasable bad erase block if the erase operation is not completed after application of a number of voltage pulses equal to a predetermined number, sets the flag on this bad erase block, and does not allow the data from the host system to be stored in the erase block. The method also determines that an erase block is a writable and erasable normal erase block if the erase operation is completed by application of a number of voltage pulses not to exceed the predetermined number, stores the number of voltage pulses used for erasing the erase block, and stores the data from the host system in this normal erase block.

In this method, voltage pulses are applied to that erase block of the memory which has an empty area but does not have a flag set and which has the smallest number of recorded voltage pulses.

BRIEF DESCRIPTION OF THE DRAWINGS

These and other objects and features of the present invention will become clear from the following description taken in conjunction with the preferred embodiment thereof with reference to the accompanying drawings throughout which like parts are designated by like reference numerals, and in which.

DETAILED DESCRIPTION OF THE PREFERRED EMBODIMENT

The present invention will be described with reference to embodiments shown in the accompanying drawings.

Embodiment 1

Figure 1:
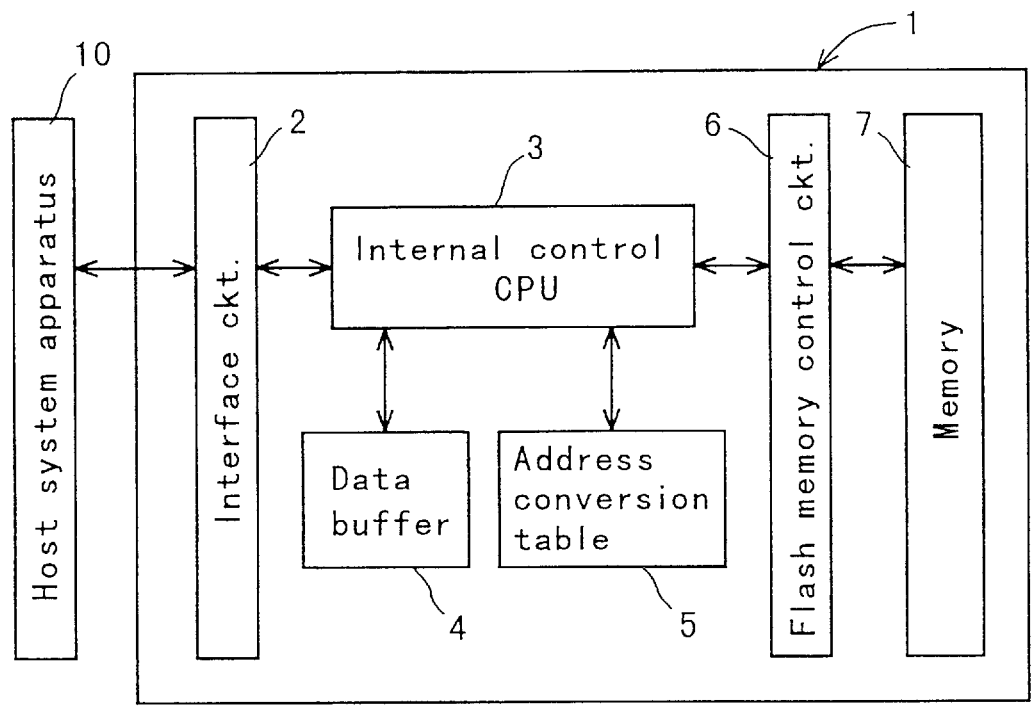
FIG. 1 is a schematic block diagram of the storage device of Embodiment 1 of the present invention.

FIG. 1 is a schematic block diagram of the storage device of Embodiment 1. Referring to FIG. 1, the storage device 1 comprises an interface circuit 2, an internal control CPU 3, a data buffer 4 for data input and output, an address conversion table 5, a flash memory control circuit 6, and memory unit 7 formed with flash memories. The interface circuit 2 is connected to the internal control CPU 3 which, in turn, is connected to the data buffer 4, the address conversion table 5, and the memory unit 7 through the flash memory control circuit 6.

A host system 10 comprises an information processing device. When the host system 10 is connected to the storage device 1 with the above configuration, it is connected to the internal control CPU 3 through the interface circuit 2. The interface circuit 2 forms an interface unit, and the internal control CPU 3 and the flash memory control circuit 6 form a control unit.

In the above configuration, the interface circuit 2 exchanges data with the host system 10. The internal control CPU 3 manages the functions of the storage device 1 by controlling the signals inside the storage device 1. The flash memory control circuit 6 controls the memory unit 7 by sending to the memory unit 7 control signals such as an output enable signal and a chip select signal depending upon a write or a read command and an address sent from the internal control CPU 3. For example, when the flash memory control circuit 6 receives a sector number from the internal control CPU 3, it generates address data for the memory unit 7 corresponding to the received sector number and sends it to the memory unit 7.

The flash memory comprised in the memory unit 7 is electrically writable and erasable, nonvolatile memory. Data erase is performed in an entire erase block of a few kilobytes to a few tens of kilobytes bytes. Overwrite on the same address is forbidden. Data is written to or read from the flash memory of the memory unit 7 in only 8 bits or 16 bits, whereas data must be exchanged with the host system 10 in 512 bytes. Thus the data buffer 4 is used as a cash memory for the internal control CPU 3 and the memory unit 7.

Figure 2:
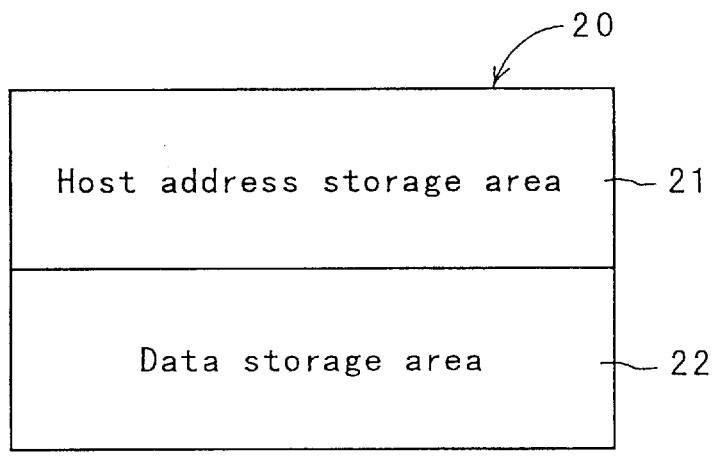
FIG. 2 schematically shows the structure of the erase block of the flash memory used in the memory 7 shown in FIG. 1.

The memory unit 7 comprises a few to a few tens of flash memories which each include a plurality of erase blocks. FIG. 2 schematically shows the structure of the erase block of the flash memory used in the memory unit 7. Referring to FIG. 2, the erase block 20 comprises a host address storage area 21 which stores address data sent from the host system 10 and a data storage area 22 which stores data also sent from the host system 10.

The address conversion table 5 associates an LSA or a logical sector address, the host system 10 uses for data management, with a PSA or a physical sector address used for data management inside the storage device 1. The LSA is fixed while the PSA can be rewritten as desired by the internal control CPU 3. Thus, the address conversion table 5 allows the storage device 1 to store data in any desired area of the flash memories of the memory unit 7 regardless of the LSA required by the host system 10. Since the address conversion table 5 is rewritten very frequently, it is formed with SRAM or DRAM.

When the host system 10 requires the internal control CPU 3, through the interface circuit 2, to write data in a designated LSA, the internal control CPU 3 issues a write command to the flash memory control circuit 6 and refers to the address conversion table 5 to find an empty area in the memory unit 7. If it finds an empty area, it outputs the PSA corresponding to the empty area to the flash memory control circuit 6.

The flash memory control circuit 6, following the command issued by the internal control CPU 3, converts the PSA sent from the internal control CPU 3 to the address of the flash memory of the memory unit 7 and then sends the control signals such as the converted address, the output enable signal, and the chip select signal to the memory unit 7. At the same time the flash memory control circuit 6 writes the data sent from the host system 10 and temporarily stored in the data buffer 4 in the data storage area 22 of the erase block the internal control CPU 3 has assigned. The flash memory control circuit 6 also stores the LSA from the host system 10 in the host address storage area 21. The internal control CPU 3 updates the address conversion table 5 by storing the PSA of the erase block, associated with the LSA, where the data is stored.

When the host system 10 requires the internal control CPU 3, through the interface circuit 2, to overwrite data in a designated LSA, the internal control CPU 3 and the flash memory control circuit 6 perform the same operations as mentioned above. Thus, the data, which has been stored in the memory unit 7 before the overwrite, is not erased. The data is erased when the available data regions of the memory unit 7 become scarce. This scheme keeps the number of erase operations of the memory unit 7 to a minimum. When an erase block of the flash memory of the memory unit 7 is erased, valid data in that erase block is first transferred to an empty area of another erase block, and then the original erase block is erased. Then, the address conversion table is updated.

When an erase block of a flash memory is erased, the erase voltage is applied to each memory cell of the erase block. Actually, voltage pulses (referred to as the erase pulse hereinafter) are applied to the memory cell in order to extract electrons from the floating gate gradually. This common method requires a verification after every application of the voltage pulse to avoid over erase in which excess electrons are extracted causing the memory cell to be turned back on. A degraded flash memory needs more erase pulses to erase data therein than a fresh flash memory.

When the flash memory control circuit 6 erases an erase block of a flash memory of the memory unit 7 after receiving the write command from the internal control CPU 3, the flash memory control circuit 6 provides a pulse generation signal to the IC memory which includes the erase block to be erased. After receiving the pulse generation signal, the IC memory sends an erase pulse to each memory cell of the erase block that the flash memory control circuit 6 requested to erase. Then the flash memory control circuit 6 verifies the result, determines whether or not the erase operation has been completed, and sends this determination to the internal control CPU 3 through the flash memory control circuit 6.

If the internal control CPU 3 receives the determination from the flash memory control circuit 6 that the erase operation has not been completed, it asks the flash memory control circuit 6 if the number of the erase pulses is less than or equal to the predetermined number or the allowable number of erase pulses. If the number is less than the predetermined number, the internal control CPU 3 requests the flash memory control circuit 6 to generate another pulse generation signal. If the number is equal to the predetermined number, the internal control CPU 3 determines that the particular erase block is a bad erase block so that write and erase operations cannot be performed on that erase block and searches for another erase block to erase.

If the internal control CPU 3 receives the determination from the flash memory control circuit 6 that the erase operation has been completed, it determines that the particular erase block is writable and erasable. Then the internal control CPU 3 requests the flash memory control circuit 6 to store the data and the LSA, each from the host system 10, in the data storage area 22 and in the host address storage area 21 of that erase block respectively.

Figure 3:
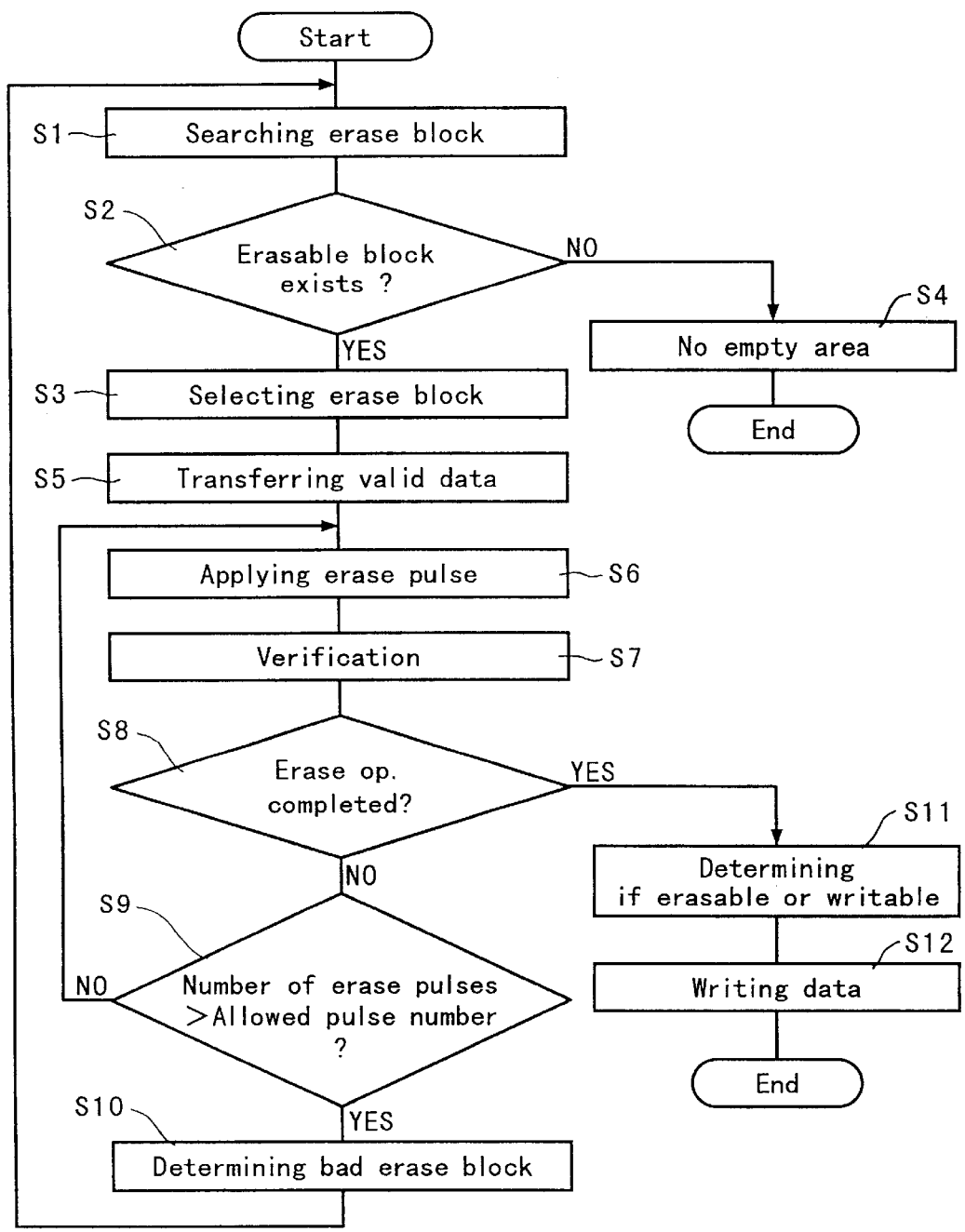
FIG. 3 is a flow chart showing the operation to erase an erase block of the storage device shown in FIGS. 1 and 2.

FIG. 3 is a flow chart showing the operation for erase an erasing block of a flash memory of the memory unit 7 of the storage device 1 shown in FIGS. 1 and 2. Referring to FIG. 3, in the step S1, the internal control CPU 3 issues a write command to the flash memory control circuit 6 and searches for an erase block that includes a usable data storage area 22 by referring to the address conversion table 5. In the step S2 the internal control CPU 3 determines whether or not an erase block of the memory unit 7 exists that includes a usable data storage area 22. If such an erase block is found (Yes), the operation advances to the step S3. If no erase blocks of the memory unit 7 that include a usable data storage area 22 (No), the internal control CPU 3 determines, in the step S4, that there is no empty area to write the data to and the operation ends.

In the step S3, the internal control CPU 3 selects an erase block that includes a usable data storage area 22 and provides the flash memory control circuit 6 with the PSA corresponding to the selected erase block. Then in the step S5 the internal control CPU 3 transfers the valid data in the selected erase block to a usable area of the data storage area 22 of another erase block through the flash memory control circuit 6. Next, in the step S6, the flash memory control circuit 6 sends, to the IC memory that includes the erase block selected by the internal control CPU 3, a pulse generation signal to cause the IC memory to apply an erase pulse to each memory cell of the selected erase block. Receiving the pulse generation signal, the IC memory applies an erase pulse to each memory cell of the erase block designated by the flash memory control circuit 6.

Next, in the step S7, the IC memory performs a verification of the erase block which received the erase pulses, and, in the step S8, it checks to determine whether or not the erase operation has been completed. If the operation has not been completed (No), the operation moves to the step S9, where the flash memory control circuit 6 checks to see whether the number of the erase pulses is less than or equal to the allowable pulse number. If the number of the erase pulses is less than the allowable pulse number (No), the operation goes back to the step S6. If the number of the erase pulses is equal to the allowable pulse number (Yes) in the step S9, the operation moves to the step S10, where the flash memory control circuit 6 sends this result to the internal control CPU 3, which, in turn, determines that the erase block which is being erased is a bad erase block. Then the operation goes back to the step S1.

If the operation has been completed (Yes) in the step S8, the operation moves to the step S11, where the flash memory control circuit 6 sends this result to the internal control CPU 3, which, in turn, determines that the erase block, which is being erased, is erasable and writable. Then the operation advances to the step S12, where the internal control CPU 3 requests the flash memory control circuit 6 to store the data and the LSA, each from the host system 10, in the data storage area 22 and in the host address storage area 21 of the erase block that has been erased, respectively. Then the operation ends.

Thus, the storage device of Embodiment 1 of the present invention determines whether or not a given erase block of a flash memory of the memory unit 7 is writable and erasable by counting the total number of erase pulses needed to erase the given erase block. If the number of erase pulses needed to erase the erase block is less than or equal to a predetermined number or an allowable number, the erase block is writable and erasable or normal. If the erase block cannot be erased by applying the allowable number of erase pulses, however, the erase block is referred to as a bad erase block. Because data from the host system is stored in a normal erase block, each erase block can be used for data storage until it is determined to be a bad erase block. Therefore, the flash memory is used more efficiently. Even if an erase block degrades for some reason, the bad erase block can easily be detected.

Embodiment 2

The storage device of Embodiment 1 does not keep a record of either the number of erase pulses needed to erase an erase block or of the identity of an erase block which has been determined to be unwritable and unerasable. Therefore, the storage device does not have any knowledge of the degradation status of each erase block, and thus may try to erase an erase block which has already been determined to be unwritable and unerasable. Obviously this is very inefficient. The storage device of Embodiment 2 of the present invention, therefore, comprises a block information storage area in which the number of erase pulses needed to erase each erase block and the location of all bad erase blocks are stored.

Figure 4:
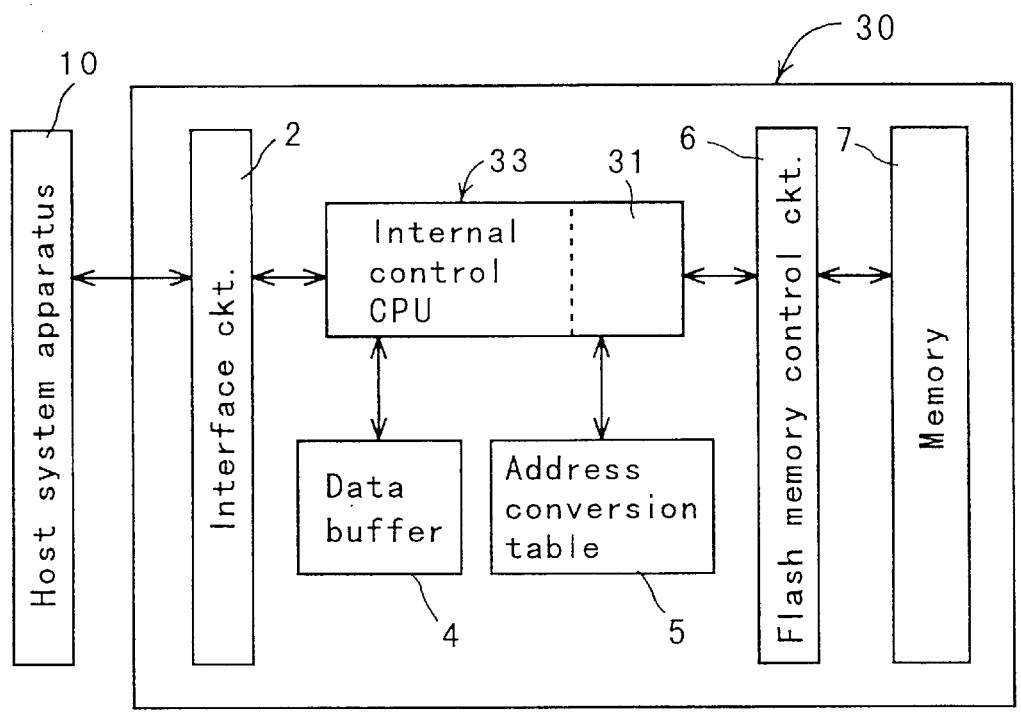
FIG. 4 is a schematic block diagram of the storage device of Embodiment 2 of the present invention.

FIG. 4 is a schematic block diagram of the storage device of Embodiment 2. The like reference numerals of FIGS. 4 and 1 indicate identical or functionally similar elements. Thus an explanation of those elements will not be repeated and only the differences between FIG. 1 and FIG. 4 will be described below. The structure of an erase block of the flash memory used in the memory unit 7 is the same as that shown in FIG. 2.

The difference between FIG. 4 and FIG. 1 is that the internal control CPU 33 shown in FIG. 4 includes a block information storage area 31 in addition to the internal control CPU 3 shown in FIG. 1. The block information storage area 31 stores the number of erase pulses needed to erase each erase block of the memory unit 7 and the block erase prohibition flag for an erase block indicating whether or not the erase block is writable and erasable. To indicate this difference, the storage device in FIG. 4 is denoted as the storage device 30. The block information storage area 31 is made up of nonvolatile memory.

Referring to FIG. 4, the storage device 30 comprises an interface circuit 2, an internal control CPU 33 with the block information storage area 31 therein, a data buffer 4, an address conversion table 5, a flash memory control circuit 6, and memory unit 7. The interface circuit 2 is connected to the internal control CPU 33 which, in turn, is connected to the data buffer 4, the address conversion table 5, and the memory unit 7 through the flash memory control circuit 6. A host system 10 comprises information processing devices. When the host system 10 is connected to the storage device 30 with the above configuration, it is connected to the internal control CPU 33 through the interface circuit 2. The internal control CPU 33 and the flash memory control circuit 6 form a control unit.

Every time the flash memory control circuit 6 sends a pulse generation signal to the IC memory of the memory unit 7, it receives a response from the memory unit 7 indicating whether or not the erase operation has been completed and then forwards this information to the internal control CPU 33. If the erase operation has been completed, the internal control CPU 33 obtains the number of erase pulses needed to erase the erase block from the flash memory control circuit 6 and stores that number in the block information storage area 31.

If the internal control CPU 33 receives the information that the erase operation has not been completed from the flash memory control circuit 6, it obtains from the flash memory control circuit 6 information as to whether the number of erase pulses is less than or equal to a predetermined number or an allowable number of erase pulses. From this information the internal control CPU 33 determines whether or not the concerned erase block is writable and erasable. Depending upon this determination the internal control CPU 33 sets the block erase prohibition flag in the block information storage area 31.

Thus, the internal control CPU 33 stores the number of erase pulses for the erase block of the memory unit 7 in the block information storage area 31 and also sets the block erase prohibition flag in the block information storage area 31 if the erase block is unwritable and unerasable.

When the internal control CPU 33 receives a request from the host system 10 through the interface circuit 2 that data be written at a designated LSA, it issues the write command to the flash memory control circuit 6 and looks for empty areas in the memory unit 7 where data can be written, referring to the address conversion table 5. If the internal control CPU 33 finds empty areas in the memory unit 7, it selects erase blocks that contain those empty areas and have no flags set. Further, the internal control CPU 33 selects, from those erase blocks, one erase block that has the smallest number of erase pulses and sends the PSA of the selected erase block to the flash memory control circuit 6.

For every pulse generation signal the flash memory control circuit 6 sends to the IC memory of the memory unit 7, the flash memory control circuit 6 receives a response from the IC memory as to whether or not the erase operation has been completed and it forwards this information to the internal control CPU 33. If the information from the flash memory control circuit 6 indicates that the erase operation has not been completed, the internal control CPU 33 asks the flash memory control circuit 6 if the number of erase pulses is less than or equal to the predetermined number or the allowable number of erase pulses. If the number is less than the predetermined number, the internal control CPU 33 requests the flash memory control circuit 6 to send another pulse generation signal. If the number is equal to the predetermined number, the internal control CPU 33 determines that the selected erase block is a bad erase block and the write or erase operation cannot be performed on this erase block, sets the block erase prohibition flag for this bad erase block in the block information storage area 31, and searches for another erase block to erase.

If the internal control CPU 33 receives the information from the flash memory control circuit 6 that the erase operation has been completed, it determines that the selected erase block is writable and erasable. The internal control CPU 33 obtains the number of erase pulses used for the erase operation from the flash memory control circuit 6 and stores it in the block information storage area 31. Then the internal control CPU 33 requests the flash memory control circuit 6 to store the data and the LSA, each from the host system 10, in the data storage area 22 and in the host address storage area 21 of the selected erase block, respectively. Since the operations of the internal control CPU 33 other than those mentioned above are the same as those of the internal control CPU 3 in FIG. 1, description of them will not be repeated.

Figure 5:
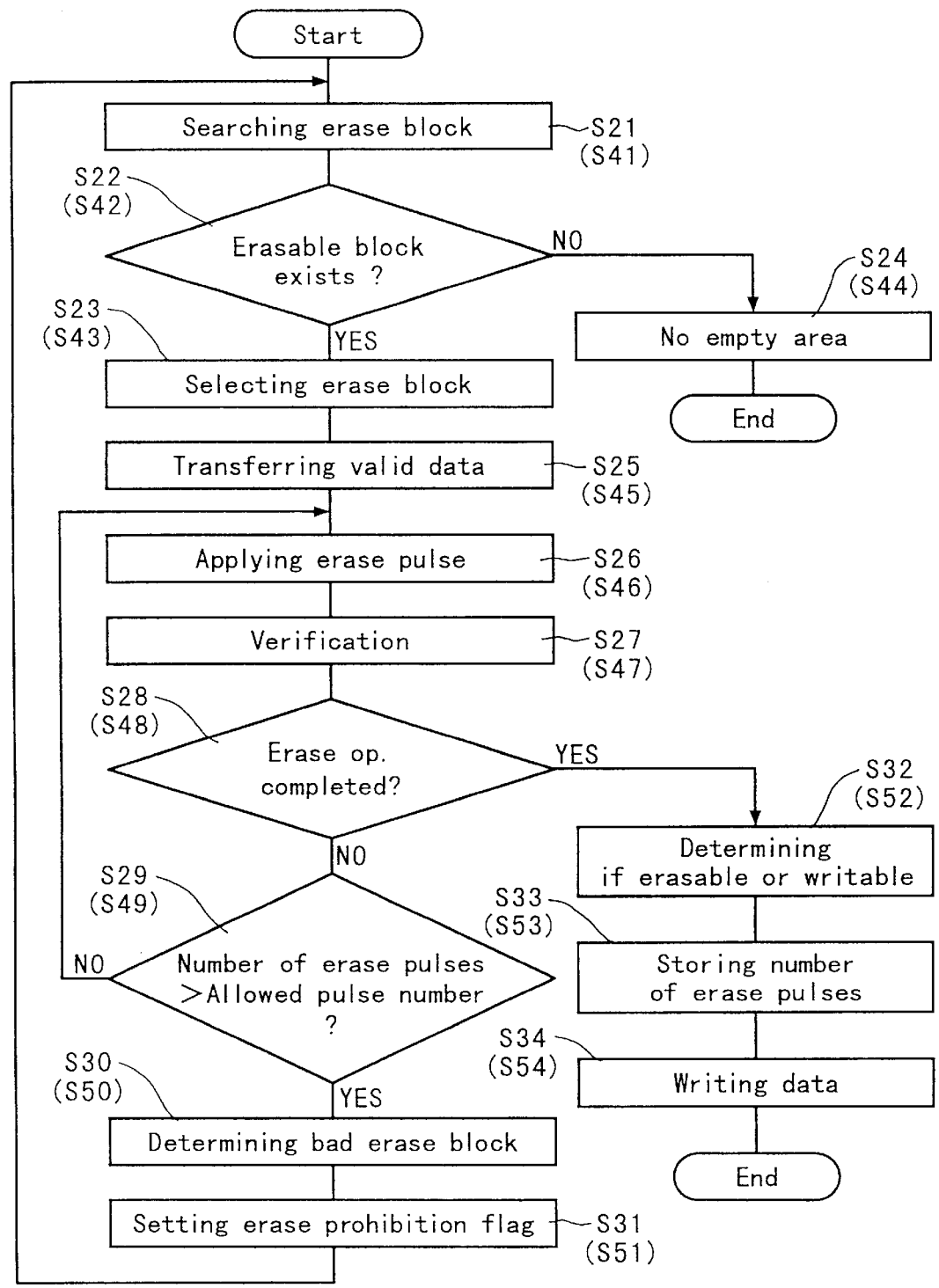
FIG. 5 is a flow chart showing the operation to erase an erase block of the storage device shown in FIG. 4.

FIG. 5 is a flow chart showing the operation to erase an erase block of a flash memory of the memory unit 7 of the storage device 30 shown in FIG. 4. Referring to FIG. 5, in the step S21, the internal control CPU 33 issues the write command to the flash memory control circuit 6 and searches for an erase block that includes a usable data storage area 22 by referring to the address conversion table 5. In the step S22 the internal control CPU 33 determines whether or not an erase block of the memory unit 7 exists that includes a usable data storage area 22. If such an erase block is found (Yes), the operation advances to the step S23. If no erase blocks of the memory unit 7 include a usable data storage area 22 (No), the internal control CPU 33 determines, in the step S24, that there is no empty area to write the data in and the operation ends.

In the step S23, the internal control CPU 33 checks, by referring to the block information storage area 31, to see whether or not those erase blocks with an empty area have the block erase prohibition flag set, and selects those that have no flag set. The internal control CPU 33 further checks the block information storage area 31 to select one that has the smallest number of erase pulses. Then the internal control CPU 33 provides the flash memory control circuit 6 with the PSA corresponding to the selected erase block. In the step S25 the internal control CPU 33 transfers valid data in the selected erase block to a usable area of the data storage area 22 of another erase block through the flash memory control circuit 6. Then the operation advances to the step S26.

In the step S26, the flash memory control circuit 6 sends, to the IC memory that includes the erase block selected by the internal control CPU 33, a pulse generation signal to cause the IC memory to apply an erase pulse to each memory cell of the selected erase block. Receiving the pulse generation signal, the IC memory applies an erase pulse to each memory cell of the erase block designated by the flash memory control circuit 6.

Next, in the step S27, the IC memory performs a verification of the erase block which received the erase pulses, and, in the step S28, checks to determine whether or not the erase operation has been completed. If the operation has not been completed (No), the operation moves to the step S29, where the flash memory control circuit 6 checks to see whether the number of the erase pulses is less than or equal to the allowable pulse number. If the number of the erase pulses is less than the allowable pulse number (No), the operation goes back to the step S26. If the number of the erase pulses is equal to the allowable pulse number (Yes) in the step 29, the operation moves to the step S30, where the flash memory control circuit 6 sends this result to the internal control CPU 33, which, in turn, determines that the erase block which is being erased is an unwritable and unerasable bad erase block. Then the operation advances to the step S31, where the internal control CPU 33 sets the block erase prohibition flag in the block information storage area 31 for this bad erase block. Then the operation goes back to the step S21.

If the erase operation has been completed (Yes) in the step S28, the operation moves to the step S32, where the flash memory control circuit 6 sends this result to the internal control CPU 33, which, in turn, determines that the erase block, which has been erased, is erasable and writable. Then the operation advances to the step S33, where the internal control CPU 33 stores the number of erase pulses needed to erase the erase block in the block information storage area 31. Then the operation advances to the step S34, where the internal control CPU 33 requests the flash memory control circuit 6 to store the data and the LSA, each from the host system 10, in the data storage area 22 and in the host address storage area 21 of the erase block that has been erased, respectively. Then the operation ends.

It should be noted that in this embodiment the block information storage area 31 is provided in the internal control CPU 33, but alternatively can be placed outside the internal control CPU 33.

Thus, the storage device of Embodiment 2 of the present invention not only provides the same advantages as Embodiment 1 but also stores the number of erase pulses needed to erase each erase block in the block information storage area 31 and also sets the block erase prohibition flag for each unwritable and unerasable erase block in the block information storage area 31. Therefore, bad blocks, which have the flag set, will not be selected again for the write and erase operation. This facilitates the selection of an erase block for the write and erase operation. Further, the internal control CPU 33 can obtain real time information as to the degradation of the erase characteristic for each erase block of the flash memory of the memory unit 7 and thus can select the best erase block available, one that has the least number of erase pulses. This allows the write and erase operations to be performed on erase blocks that have uniform write and erase characteristics.

Embodiment 3

In this embodiment the number of erase pulses for each erase block of the flash memory of the memory unit 7 is stored in its own erase block instead of in the block information storage area 31. Similarly the block erase prohibition flag for an erase block is also set in its own erase block.

Figure 6:
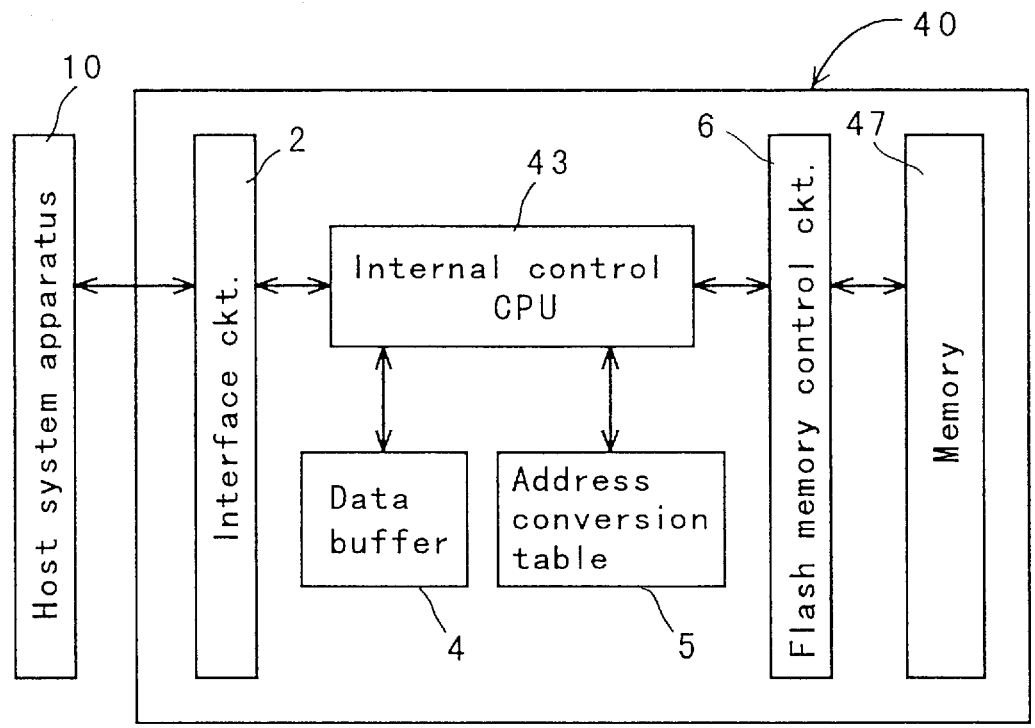
FIG. 6 is a schematic block diagram of the storage device of Embodiment 3 of the present invention.

FIG. 6 is a schematic block diagram of the storage device of Embodiment 3. The like reference numerals of FIGS. 6 and 1 indicate identical or functionally similar elements. Thus an explanation of those elements will not be repeated and only the differences between FIG. 1 and FIG. 6 will be described below.

The difference between FIG. 6 and FIG. 1 is that each erase block of the memory unit 7 includes an area for storing the number of erase pulses and an area for setting the block erase prohibition flag. The internal control CPU of this embodiment selects an erase block based on the number of erase pulses and the block erase prohibition flag stored in each erase block. Corresponding to this difference, the internal control CPU in FIG. 6 is referred to as the internal control CPU 43; the memory unit in FIG. 6, as the memory unit 47; and the storage device, as the storage device 40.

Referring to FIG. 6, the storage device 40 comprises an interface circuit 2, an internal control CPU 43, a data buffer 4, an address conversion table 5, a flash memory control circuit 6, and memory unit 47. The interface circuit 2 is connected to the internal control CPU 43 which, in turn, is connected to the data buffer 4, the address conversion table 5, and the memory unit 47 through the flash memory control circuit 6. A host system 10 comprises information processing devices. When the host system 10 is connected to the storage device 40 with the above configuration, it is connected to the internal control CPU 43 through the interface circuit 2.

Figure 7:
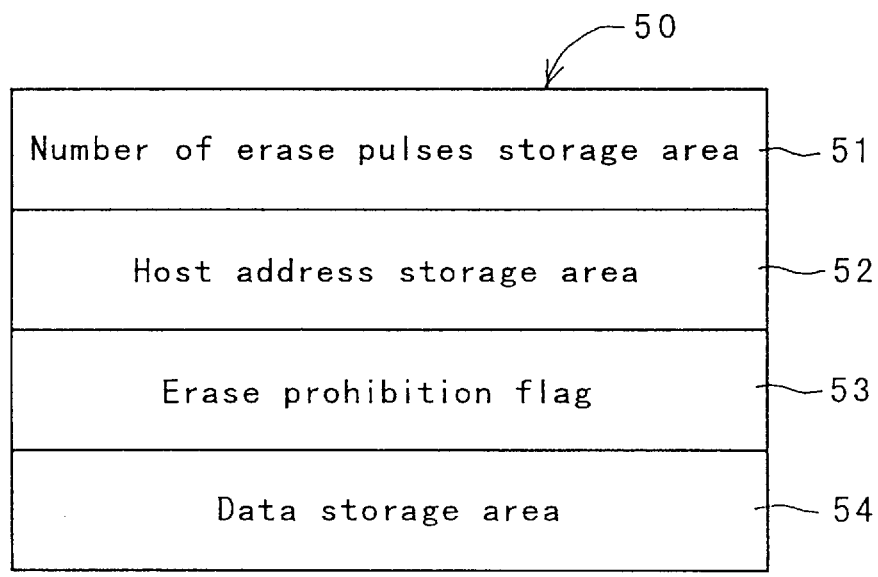
FIG. 7 schematically shows the structure of the erase block of the flash memory used in the memory 47 shown in FIG. 6.
Figure 8:
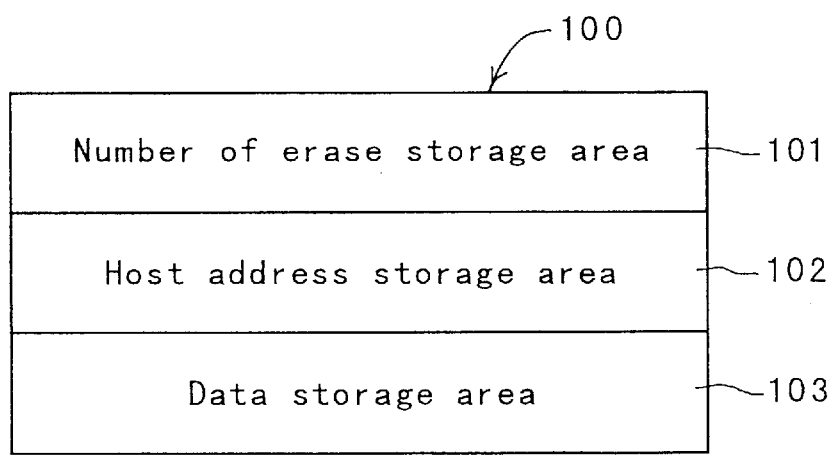
FIG. 8 is a schematic diagram showing the configuration of an erase block of a conventional flash memory.

FIG. 7 schematically shows the structure of an erase block of the flash memory used in the memory unit 47. The erase block 50 in FIG. 7 comprises an erase pulse number storage area 51 for storing the number of erase pulses provided by the flash memory control circuit 6, a host address storage area 52 for storing the address data provided by the host system 10, a block erase flag 53, and a data storage area 54 for storing the data sent from the host system 10. The internal control CPU 43 and the flash memory control circuit 6 form a control unit, and the erase pulse number storage area 51 and the block erase flag 53 form a block information storage unit.

Every time the flash memory control circuit 6 sends a pulse generation signal to the IC memory of the memory unit 47, it receives a response from the memory unit 47, indicating whether or not the erase operation has been completed, and then forwards this information to the internal control CPU 43. If the erase operation has been completed, the internal control CPU 43 obtains the number of erase pulses needed to erase the erase block from the flash memory control circuit 6 and stores this number in the erase pulse number storage area 51 of the concerned erase block.

If the internal control CPU 43 receives the information, from the flash memory control circuit 6, that the erase operation has not been completed, it obtains, from the flash memory control circuit 6, the information as to whether the number of erase pulses is less than or equal to a predetermined number or an allowable number of erase pulses. From this information the internal control CPU 43 determines whether or not the concerned erase block is writable and erasable. Depending upon this determination the internal control CPU 43 sets the block erase prohibition flag in the concerned erase block.

Thus, the internal control CPU 43 stores the number of erase pulses in the erase pulse number storage area 51 of the concerned erase block of the memory unit 47 and sets the block erase prohibition flag 53 in the erase block if the erase block is unwritable and unerasable.

When the internal control CPU 43 receives a request from the host system 10 through the interface circuit 2 that data be written at a designated LSA, it issues the write command to the flash memory control circuit 6 and searches for empty areas in the memory unit 47, where data can be written, by referring to the address conversion table 5. If the internal control CPU 43 finds empty areas in the memory unit 47, it selects, through the flash memory control circuit 6, erase blocks that contain those empty areas and have no flag set.

Further, the internal control CPU 43 checks, through the flash memory control circuit 6, the number of erase pulses stored in the pulse number storage area 51 of each of those selected erase blocks. Then it selects, from those erase blocks, an erase block that has the smallest number of erase pulses and sends the PSA associated with this selected erase block to the flash memory control circuit 6.

For every pulse generation signal the flash memory control circuit 6 sends to the IC memory of the memory unit 47, the flash memory control circuit 6 receives a response from the IC memory as to whether or not the erase operation has been completed and it forwards this information to the internal control CPU 43. If the information from the flash memory control circuit 6 is that the erase operation has not been completed, the internal control CPU 43 asks the flash memory control circuit 6 whether the number of erase pulses is less than or equal to the predetermined number or the allowable number of erase pulses. If the number is less than the predetermined number, the internal control CPU 43 requests the flash memory control circuit 6 to send another pulse generation signal. If the number is equal to the predetermined number, the internal control CPU 43 determines that the selected erase block is a bad erase block so that the write and erase operation cannot be performed on this erase block, sets the block erase prohibition flag 53 in this bad erase block, and searches for another erase block to erase.

If the internal control CPU 43 receives the information from the flash memory control circuit 6 that the erase operation has been completed, it determines that the selected erase block is writable and erasable. The internal control CPU 43 stores the number of erase pulses, through the flash memory control circuit 6, in the erase pulse number storage area 51 of the selected erase block. Then the internal control CPU 43 requests the flash memory control circuit 6 to store the data and the LSA, each from the host system 10, in the data storage area 54 and in the host address storage area 52 of the selected erase block, respectively. Since the operations of the internal control CPU 43 other than those mentioned above are the same as those of the internal control CPU 3 in FIG. 1, the description of them will not be repeated.

A flow chart for the operation to erase an erase block of a flash memory of the memory unit 47 of the storage device 40 shown in FIGS. 6 and 7 is the same as the one shown in FIG. 5. However, the processing of each step of the present storage device 40 is different from those of the storage device shown in FIG. 5. The operation of the present storage device 40 will be described with reference to the numerals in parentheses (S41–S54) in FIG. 5.

In the step S41, the internal control CPU 43 issues the write command to the flash memory control circuit 6 and searches for an erase block that includes a usable data storage area 54 by referring to the address conversion table 5. In the step S42 the internal control CPU 43 determines whether or not an erase block in the memory unit 47 exists that includes a usable data storage area 54. If so (Yes), the operation advances to the step S43. If no erase block of the memory unit 47 includes a usable data storage area 54 (No), the internal control CPU 43 determines, in the step S44, that there is no empty area to write the data in and the operation ends.

In the step S43, the internal control CPU 43 checks to determine whether or not those erase blocks with an empty area have a block erase prohibition flag set, and selects those that have no flag set. The internal control CPU 43 further checks the erase pulse number storage areas 51 of those selected erase blocks to select the one that has the smallest number of erase pulses. Then the internal control CPU 43 provides the flash memory control circuit 6 with the PSA corresponding to the selected erase block. In the step S45 the internal control CPU 43 transfers valid data in the selected erase block to the usable area of the data storage area 54 of another erase block through the flash memory control circuit 6. Then the operation advances to the step S46.

Next, in the step S46, the flash memory control circuit 6 sends a pulse generation signal to the IC memory that includes the erase block selected by the internal control CPU 43 to cause the IC memory to apply an erase pulse to each memory cell of the selected erase block. Receiving the pulse generation signal, the IC memory applies an erase pulse to each memory cell of the erase block designated by the flash memory control circuit 6.

Next, in the step S47, the IC memory performs a verification of the erase block which received the erase pulses, and, in the step S48, checks to determine whether or not the erase operation has been completed. If the operation has not been completed (No), the operation moves to the step S49, where the flash memory control circuit 6 checks to see whether the number of the erase pulses is less than or equal to the allowable number of pulses. If the number of the erase pulses is less than the allowable pulse number (No), the operation goes back to the step S46.

If the number of the erase pulses is equal to the allowable pulse number (Yes) in the step 49, the operation moves to the step S50, where the flash memory control circuit 6 sends this result to the internal control CPU 43, which, in turn, determines that the erase block which has been erased is an unwritable and unerasable bad erase block. Then the operation advances to the step S51, where the internal control CPU 43 sets the block erase prohibition flag 53 in the erase block. Then the operation goes back to the step S41.

If the erase operation has been completed (Yes) in the step S48, the operation moves to the step S52, where the flash memory control circuit 6 sends this result to the internal control CPU 43, which, in turn, determines that the erase block, which has been erased, is erasable and writable. Then the operation advances to the step S53, where the internal control CPU 43 stores the number of erase pulses needed to erase the erase block in the erase pulse number storage area 51 of the erase block that has just been erased. Then the operation advances to the step S54, where the internal control CPU 43 requests the flash memory control circuit 6 to store the data and the LSA, each from the host system 10, in the data storage area 54 and in the host address storage area 52 of the concerned erase block, respectively. Then the operation ends.

Thus, the storage device of Embodiment 3 of the present invention provides the same advantages as Embodiment 1. Further, an erase block of the storage device of the present embodiment has an area for storing the number of erase pulses needed to erase itself and an area for the block erase prohibition flag. Therefore, bad erase blocks, which already have the block erase flags set, will not be selected again for the write and erase operations. This facilitates the selection of an erase block for the write and erase operations. Further, the internal control CPU 43 can obtain real time information as to the degradation of the erase characteristic for each erase block of the flash memory of the memory unit 47, and thus can select the best erase block available, one that has the least number of erase pulses. This allows the write and erase operations to be performed on erase blocks having uniform write and erase characteristics.

As indicated by the above explanation, the control unit of the present invention searches for an erase block with an empty area by referring to the address conversion table and issues a command signal to the memory unit to cause the memory unit to apply voltage pulses to the selected erase block. The memory unit checks to determine whether or not the erase operation has been completed every time the voltage pulse is applied to the erase block. If the erase operation has not been completed, the control unit issues another command signal to cause the memory unit to apply another voltage pulse to the erase block and, based on the number of voltage pulses applied to the erase block, determines the level of the degradation of the erase characteristic of the erase block.

If the erase operation is not completed by application of a number of voltage pulses equal to a predetermined number, the control unit determines that the erase block is an unwritable and unerasable bad erase block, and does not allow the data from the host system to be stored in this bad erase block. If the erase operation is completed by application of a number of voltage pulses not to exceed the predetermined number, the control unit determines that the erase block is a writable and erasable normal erase block, and stores the data from the host system in this normal erase block.

Thus, the storage device of the present invention determines whether or not a given erase block of the nonvolatile memory of the memory unit is writable and erasable by checking the number of erase pulses needed to erase the given erase block. If the number of erase pulses needed to erase the erase block is less than or equal to a predetermined number, the erase block is writable and erasable or normal. If the erase block cannot be erased by applying the allowable number of erase pulses, however, the erase block is referred to as a bad erase block. Data from the host system is stored in a normal erase block. Therefore, each erase block can be used for data storage until it is determined to be a bad erase block, and, in this way, the nonvolatile memory is used more efficiently. Even if an erase block degrades for some reason, the bad erase block can easily be detected. This improves the reliability of the storage device.

The storage device of the present invention may have a block information storage area which is formed with nonvolatile memory in either the control unit or an individual erase block. The block information storage area stores a flag for an erase block. The erase block with the flag set is not allowed to be used for storing data. That is, if the erase operation is not completed by applying a number of voltage pulses equal to the predetermined number, the control unit determines that the erase block is an unwritable and unerasable bad erase block, sets the flag on this bad erase block, and does not allow the data from the host system to be stored in this bad erase block. If the erase operation is completed by applying a number of voltage pulses less than or equal to the predetermined number, the control unit determines that an erase block is a writable and erasable normal erase block, stores the number of voltage pulses in the block information storage area, and stores the data from the host system in this normal erase block.

Thus, bad blocks, which have a flag set, will not be selected for the write and erase operation. This permits efficient selection of an erase block for the write and erase operation. Further, the ability to obtain real time information as to the degradation of the erase characteristic for each erase block of the nonvolatile memory of the memory unit improves the reliability of the storage device.

The control unit requests that the memory unit apply voltage pulses to an erase block of the memory unit that has an empty area but does not have a flag set and that has the smallest number of voltage pulses recorded in the block information storage area. Therefore, the storage device can select, for the write and erase operations, the best erase block available, one that has the least number of erase pulses. This allows the write and erase operations to be performed on erase blocks that have uniform write and erase characteristics.

The present invention also provides a method of determining the level of degradation of the erase characteristic of a storage device. This method comprises steps of searching, by referring to the address conversion table, for an erase block of the memory means with an empty area for storing data; applying voltage pulses to the selected erase block with an empty area; checking to determine whether or not the erase operation on the erase block has been completed every time the voltage pulse is applied to the erase block; repeating the application of a voltage pulse to the erase block if the erase operation has not been completed; and determining the level of degradation of the erase characteristic of the erase block based on the number of voltage pulses applied to the erase block.

In other words, if the erase operation is not completed by applying a number of voltage pulses equal to a predetermined number, the erase block is determined to be an unwritable and unerasable bad erase block. Data from the host system is not allowed to be stored in this bad erase block. If the erase operation is completed by applying a number of voltage pulses less than or equal to a predetermined number, however, the erase block is determined to be a writable and erasable normal erase block. The data from the host system is allowed to be stored in this normal erase block.

Thus, the storage device of the present invention determines whether or not a given erase block of nonvolatile memory is writable and erasable by checking the number of erase pulses needed to erase the given erase block. If the number of erase pulses needed to erase the erase block is less than or equal to a predetermined number, the erase block is writable and erasable or normal. If the erase block cannot be erased by applying the allowable number of erase pulses, however, the erase block is referred to as a bad erase block. Data from the host system is stored in a normal erase block. Therefore, each erase block can be used for data storage until it is determined to be a bad erase block. In this way, the nonvolatile memory is used more efficiently. Even if an erase block degrades for some reason, the bad erase block can easily be detected. This improves the reliability of the storage device.

This method may further comprise the steps of storing the number of voltage pulses needed to erase each erase block every time the erase operation is performed on the erase block, and setting a flag for a bad erase block so that this bad erase block cannot be used. That is, in this method, if the erase operation is not completed by applying a number of voltage pulses equal to the predetermined number, the control unit determines that the erase block is an unwritable and unerasable bad erase block, sets the flag on this bad erase block, and does not allow the data from the host system to be stored in this bad erase block. If the erase operation is completed by applying a number of voltage pulses equal to or less than the predetermined number, the control unit determines that the erase block is a writable and erasable normal erase block, stores the number of voltage pulses, and stores the data from the host system in this normal erase block.

Thus, bad blocks, which have a flag set, will not be selected again for the write and erase operation. This permits efficient selection of an erase block for the write and erase operation. Further, the ability to obtain the real time information as to the degradation of the erase characteristic for each erase block of the nonvolatile memory improves the reliability of the storage device.

Further, the control unit requests the memory unit to apply voltage pulses to an erase block that has an empty area but does not have a flag set and that has the smallest number of voltage pulses recorded. Therefore, the storage device can select, for the write and erase operations, the best erase block available, one that has the least number of erase pulses. This allows the write and erase operations to be performed on erase blocks that have uniform write and erase characteristics.

Although the present invention has been fully described in connection with the preferred embodiment thereof with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. A storage device utilizing a block-erase type nonvolatile memory used in conjunction with a host system comprising an information processing device, comprising:

an interface circuit for connecting said storage device to the host system;

a memory comprising a plurality of block-erase type, nonvolatile memories that can be erased by applying voltage pulses;

a control circuit for managing and controlling said memory and for exchanging data with the host system through said interface circuit; and an address conversion table for associating a logical sector address, which the host system uses for data management, with a physical sector address, which said storage device uses for data management therein;

said control circuit searching for an erase block with an empty area by referring to said address conversion table and issuing a command signal to said memory to cause said memory unit to apply voltage pulses to the erase block;

said memory checking to determine whether or not the erase operation has been completed every time the voltage pulse is applied to the erase block;

said control circuit, if the erase operation has not been completed, issuing another command signal to cause said memory unit to apply another voltage pulse to the erase block and determining the level of the degradation of the erase characteristic of the erase block based on the number of voltage pulses applied to the erase block.

2. The storage device of claim 1 wherein, if the erase operation is not completed after application of a number of voltage pulses exceeding a predetermined number, said control unit determines that the erase block is an unwritable and unerasable bad erase block, and does not allow the data from the host system to be stored in this bad erase block.

3. The storage device of claim 1 wherein, if the erase operation is completed by application of a number of voltage pulses not greater than a predetermined number, said control unit determines that the erase block is a writable and erasable normal erase block, and stores the data from the host system in this normal erase block.

4. The storage device of claim 1 further comprising a block information storage area which stores the number of voltage pulses needed to erase each erase block of said memory unit when the erase operation is performed on the erase block and which also stores a flag for a bad erase block so that said control unit does not use the erase block.

5. The storage device of claim 4 wherein said control unit determines that an erase block is an unwritable and unerasable bad erase block if the erase operation is not completed by application of a number of voltage pulses equal to a predetermined number, sets the flag on this bad erase block, and does not allow the data from the host system to be stored in this bad erase block.

6. The storage device of claim 5 wherein said control unit requests said memory unit to apply voltage pulses to an erase block of said memory unit that has an empty area but does not have the flag set and that has the smallest number of voltage pulses recorded in the block information storage area.

7. The storage device of claim 4 wherein said control unit determines that an erase block is a writable and erasable normal erase block if the erase operation is completed by application of a number of voltage pulses which does not exceed a predetermined number, stores the number of voltage pulses in the block information storage area, and stores the data from the host system in this normal erase block.

8. The storage device of claim 4 wherein said block information storage area is formed with nonvolatile memory.

9. The storage device of claim 8 wherein said block information storage area is formed within said control unit.

10. The storage device of claim 8 wherein said block information storage area is formed within each erase block of said memory unit.

11. A method of determining the level of degradation of the erase characteristic of a storage device comprising an interface circuit for connecting said storage device to a host system comprising information processing devices; a memory comprising a plurality of block-erase type, non-volatile memories that can be erased by applying voltage pulses; a control circuit for managing and controlling said memory and for exchanging data with the host system through said interface circuit; and an address conversion table for associating a logical sector address, which the host system uses for data management, with a physical sector address, which the storage device uses for data management therein; said method comprising steps of:

searching, by referring to said address conversion table, for an erase block of said memory with an empty area for storing data;

applying voltage pulses to the selected erase block with an empty area;

checking to determine whether or not the erase operation on the erase block has been completed every time the voltage pulse is applied to the erase block;

repeating the application of a voltage pulse to the erase block if the erase operation has not been completed; and determining the level of degradation of the erase characteristic of the erase block based on the number of voltage pulses applied to the erase block.

12. The method of claim 11, of determining the level of degradation of the erase characteristic of the storage device, further comprising steps of:

determining that an erase block is an unwritable and unerasable bad erase block if the erase operation is not completed by application of a number of voltage pulses equal to a predetermined number; and not allowing the data from the host system to be stored in this bad erase block.

13. The method of claim 11, of determining the level of degradation of the erase characteristic of the storage device, further comprising steps of:

determining that an erase block is a writable and erasable normal erase block if the erase operation is completed by application of a number of voltage pulses which does not exceed a predetermined number; and storing the data from the host system in this normal erase block.

14. The method of claim 11, of determining the level of degradation of the erase characteristics of the storage device, further comprising step of:

storing the number of voltage pulses needed to erase each erase block every time the erase operation is performed on the erase block; and setting a flag for a bad erase block so that this bad erase block cannot be used.

15. The method of claim 14, of determining the level of degradation of the erase characteristics of the storage device, further comprising steps of:

determining that an erase block is an unwritable and unerasable bad erase block if the erase operation is not completed after application of a number of voltage pulses equal to a predetermined number; and setting the flag on this bad erase block and not allowing the data from the host system to be stored in the erase block.

16. The method of claim 14, of determining the level of degradation of the erase characteristic of the storage device, further comprising steps of:

determining that an erase block is a writable and erasable normal erase block if the erase operation is completed by application of a number of voltage pulses which does not exceed the predetermined number; and storing the number of voltage pulses and storing the data from the host system in this normal erase block.

17. The method of claim 14, of determining the level of degradation of the erase characteristic of the storage device, wherein said control circuit requests said memory means to apply voltage pulses to an erase block of said memory means that has an empty area but does not have the flag set and that has the smallest number of voltage pulses stored.

* * * * *